(12) United States Patent
Liao et al.

(10) Patent No.: US 11,652,404 B2
(45) Date of Patent: May 16, 2023

(54) METHOD FOR CALIBRATING CURRENTS, CURRENT CONTROL SYSTEM, AND VOLTAGE CONTROL SYSTEM

(71) Applicant: REALTEK SEMICONDUCTOR CORPORATION, Hsinchu (TW)

(72) Inventors: Yi-Ching Liao, Hsinchu (TW); Chih-Yu Chen, Hsinchu (TW); Yu Hsun Hung, Hsinchu (TW); Juei Chin Shen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/693,058

(22) Filed: Mar. 11, 2022

(65) Prior Publication Data
US 2022/0407414 A1 Dec. 22, 2022

(30) Foreign Application Priority Data
Jun. 17, 2021 (TW) ................................. 110122143

(51) Int. Cl.
*H02M 3/04* (2006.01)
(52) U.S. Cl.
CPC ..................................... *H02M 3/04* (2013.01)
(58) Field of Classification Search
None
See application file for complete search history.

(56) References Cited

U.S. PATENT DOCUMENTS

| 7,394,414 | B2 | 7/2008 | Briaire |
| 7,541,953 | B2 | 6/2009 | Chen et al. |
| 8,295,214 | B2 | 10/2012 | Chandra et al. |
| 9,046,908 | B2 * | 6/2015 | Gong ........................ G05F 1/46 |
| 2022/0247424 | A1 * | 8/2022 | Shen ..................... H03M 1/742 |

OTHER PUBLICATIONS

Tao Zeng and Degang Chen, "An Order-Statistics Based Matching Strategy for Circuit Components in Data Converters," in IEEE Transactions on Circuits and System I: Regular Papers, vol. 60, No. 1, pp. 11-24, published on Jan. 4, 2013.
Tao Chen and Georges Gielen, "A 14-bit 200-MHz Current-Steering DAC With Switching-Sequence Post-Adjustment Calibration," in IEEE Journal of Solid-State Circuits, vol. 42, issue: 11, Nov. 2007.

* cited by examiner

*Primary Examiner* — Jeffery S Zweizig
(74) *Attorney, Agent, or Firm* — WPAT, P.C., Intellectual Property Attorneys; Anthony King

(57) ABSTRACT

A method for calibrating currents includes performing a first sorting operation on a plurality of first current sources according to current levels generated by the first current sources, performing a second sorting operation on a plurality of second current sources according to current levels generated by the second current sources, determining a first switching sequence for the first plurality of current sources according to a result of the first sorting operation, and determining a second switching sequence for the second plurality of current sources according to a result of the second sorting operation and the first switching sequence. The plurality of first current sources have a same target current value, and the plurality of second current sources have a same target current value.

20 Claims, 9 Drawing Sheets

METHOD FOR CALIBRATING CURRENTS, CURRENT CONTROL SYSTEM, AND VOLTAGE CONTROL SYSTEM

CROSS-REFERENCE TO RELATED APPLICATIONS

This application claims priority of Taiwan application No. 110122143 filed on Jun. 17, 2021, which is incorporated by reference in its entirety.

TECHNICAL FIELD

The present application relates to a method, particularly a method for calibrating output currents and a related current control system.

BACKGROUND

A digital-to-analog converter (DAC) converts a digital input signal into an analog output signal. For example, a DAC can generate a current corresponding to the value of the digital signal as an output signal. Conventionally, a DAC can contain multiple current sources and can enable a corresponding number of current sources depending on the desired output current value. However, due to process differences, different current sources may actually generate different current levels even if they have the same target current value, which results in poor linearity between the analog output current signal and the digital input numerical signal.

In addition, in communication transmission applications, a signal transceiver circuit often converts a digital signal to a current signal to be outputted using a DAC. Since the signal sent by the signal transceiver circuit itself generates echo noise in the transmission channel, an echo canceller is often used to detect the echo noise in the transmission channel and output an inverted echo compensation signal to attenuate the echo noise in the transmission channel, so as to reduce the effect of echo noise on the signal transmission quality. However, if there is a mismatch between the signal transceiver circuit and the DAC used in the echo canceller (for example, if they have different integral non-linearity (INL) trends in the output step current), the waveform of the echo compensation signal will be different from that of the echo noise, resulting in poor echo cancellation and even the generation of new noise. Therefore, it is still a problem to be solved to properly calibrate different current sources in order to improve the match when they output currents.

SUMMARY OF THE INVENTION

One embodiment of the present disclosure discloses a method for calibrating output current. The method comprises performing a first sorting operation on a plurality of first current sources according to current levels outputted by the plurality of first current sources, performing a second sorting operation on a plurality of second current sources according to current levels outputted by the plurality of second current sources, determining a first switching sequence of the plurality of first current sources according to a result of the first sorting operation, and determining a second switching sequence of the plurality of second current sources according to a result of the second sorting operation and the first switching sequence. Each of the plurality of first current sources has a same first target current value, and each of the plurality of second current sources has a same second target current value.

Another embodiment of the present disclosure discloses a current control system. The current control system comprises a first current output circuit, a second current output circuit, and a control circuit. The first current output circuit comprises a plurality of first current sources, wherein the plurality of first current sources have a same first target current value. The second current output circuit comprises a plurality of second current sources, wherein the plurality of second current sources have a same second target current value. The control circuit is coupled to the first current output circuit and the second current output circuit and configured to perform a first sorting operation on the plurality of first current sources according to current levels outputted by the plurality of first current sources, perform a second sorting operation on the plurality of second current sources according to current levels outputted by the plurality of second current sources, determine a first switching sequence of the plurality of first current sources according to a result of the first sorting operation, and determine a second switching sequence of the plurality of second current sources according to a result of the second sorting operation and the first switching sequence.

Another embodiment of the present disclosure discloses a voltage control system. The voltage control system comprises a first voltage output circuit, a second voltage output circuit, and a control circuit. The first, voltage output circuit comprises a plurality of first voltage divider units, wherein the plurality of first voltage divider units have a same first target divided voltage level. The second voltage output circuit comprises a plurality of second voltage divider units, wherein the plurality of second voltage divider units have a same second target divided voltage level. The control circuit is coupled to the first voltage output circuit and the second voltage output circuit and configured to perform a first sorting operation on the plurality of first voltage divider units according to divided voltage levels outputted from the plurality of first voltage divider units, perform a second sorting operation on the plurality of second voltage divider units according to divided voltage levels outputted from the plurality of second voltage divider units, determine a first series connection sequence of the plurality of first voltage divider units according to a result of the first sorting operation, and determine a second series connection sequence of the plurality of second voltage divider units according to a result of the second sorting operation and the first series connection sequence.

DETAILED DESCRIPTION

Figure 1:
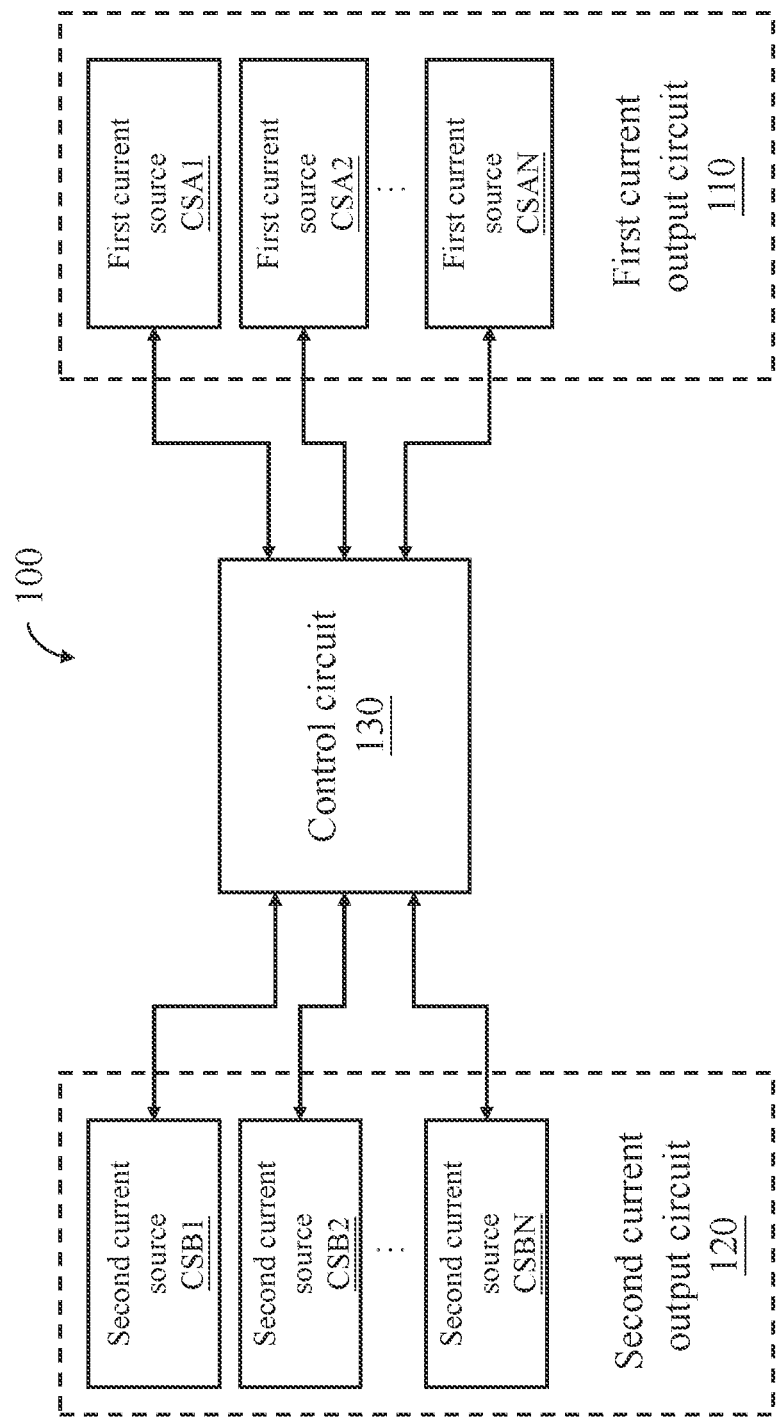
FIG. 1 is a schematic diagram illustrating a current control system according to one embodiment of the present disclosure.

FIG. 1 is a schematic diagram illustrating a current control system 100 according to one embodiment of the present disclosure. The current control system 100 can include a first current output circuit 110, a second current output circuit 120, and a control circuit 130. The control circuit 130 is coupled to the first current output circuit 110 and the second current output circuit 120.

In the present embodiment, the first current output circuit 110 can include N first current sources CSA1 to CSAN (some of them are omitted in the drawings), and the second current output circuit 120 can include N second current sources CSB1 to CSBN (some of them are omitted in the drawings), wherein N is an integer greater than 1. Although the first current sources CSA1 to CSAN have the same target current value, the actual current generated by the first current sources CSA1 to CSAN may deviate from the target current value to different degrees due to variations caused during the manufacturing process. Similarly, although the second current sources CSB1 to CSBN have the same target current value, variations caused during the manufacturing processes may make the actual current generated by the current sources CSB1 to CSBN deviate from the target current value to different degrees.

In such cases, the order in which the first current output circuit 110 to switch on/off the first current sources CSA1 to CSAN and the order in which the second current output circuit 120 110 to switch on/off the second current sources CSB1 to CSBN will affect the matching degree when these two current output circuits 110 and 120 output the current. For the convenience of understanding, in the present embodiment, the first current sources CSA1 to CSAN are numbered in ascending order of the current outputted thereby. In other words, the current outputted from the first current source CSA2 is greater than the current outputted from the first current source CSA1, the current outputted from the first current source CSA3 is greater than the current outputted from the first current source CSA2, and the current outputted from the first current source CSAN is greater than the current outputted from any of the above-mentioned first current sources CSA1 to CSA(N−1) (omitted in the drawings). Similarly, the second current sources CSB1 to CSBN are also numbered in ascending order of the current outputted thereby.

Figure 2:
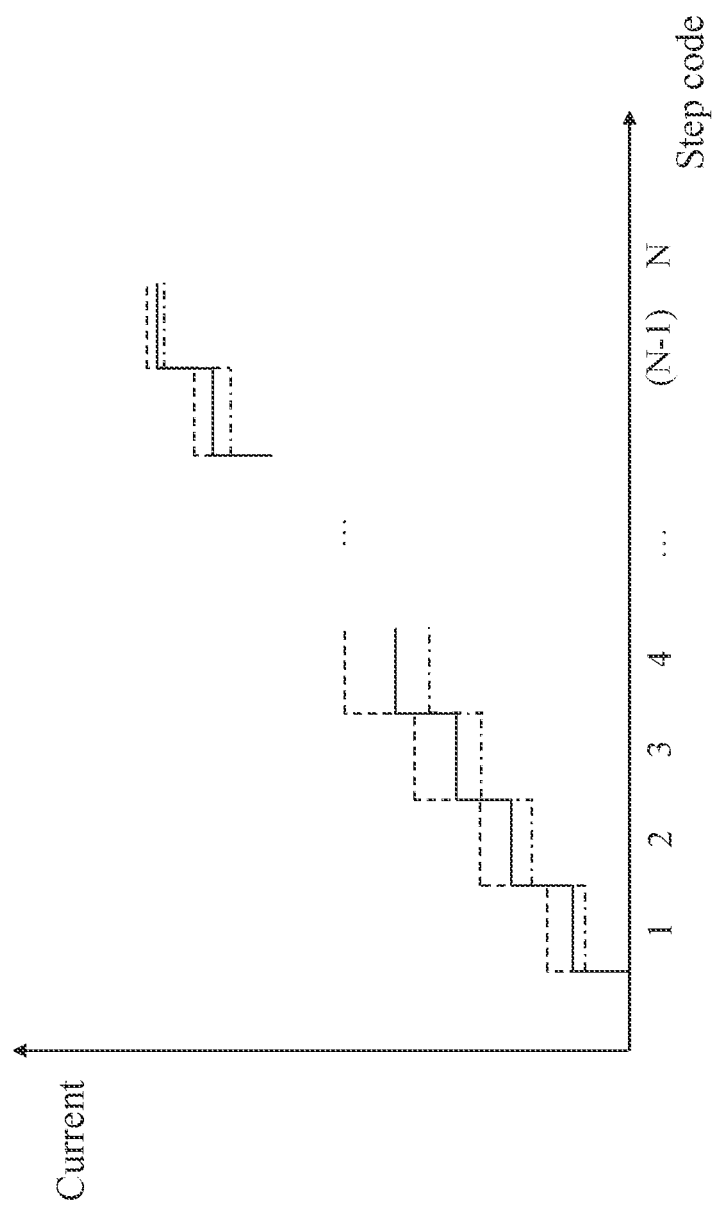
FIG. 2 shows the current levels that corresponds to each step code outputted from the first current output circuit and the second current output circuit according to a particular switching sequence.
Figure 3:
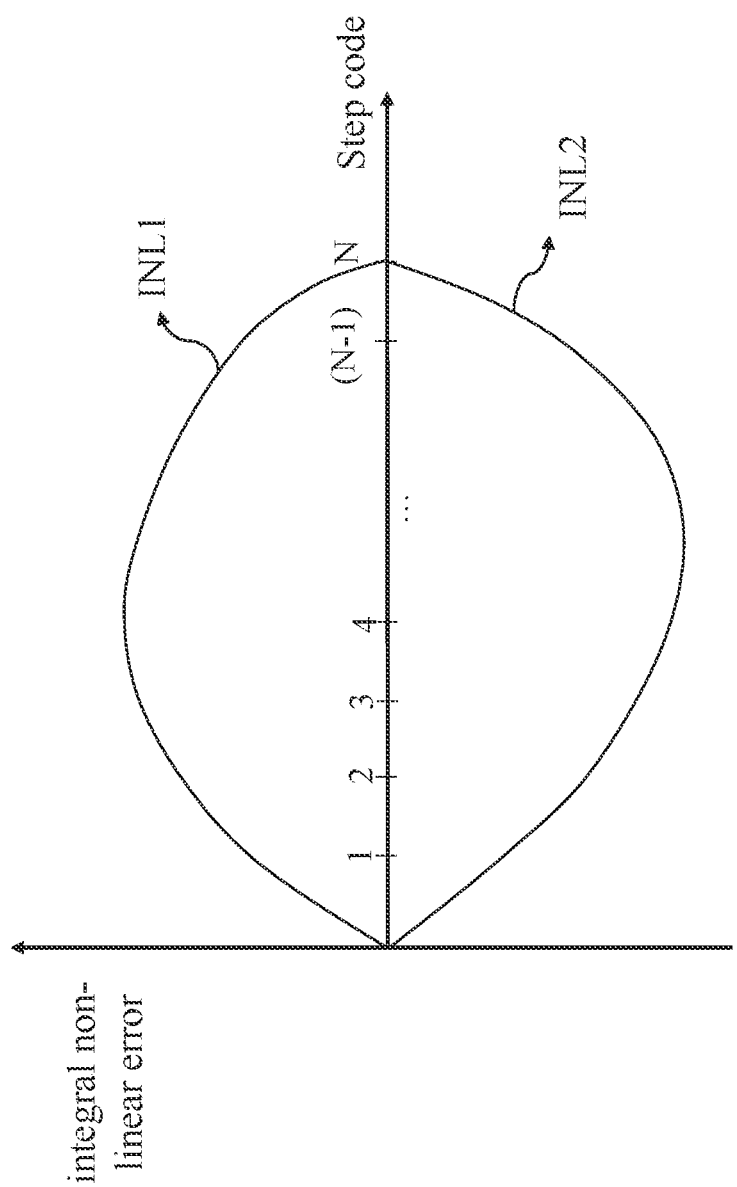
FIG. 3 shows the integral non-linear curve of the first current output circuit and the integral non-linear curve of the second current output circuit according to the same particular switching sequence as in FIG. 2

FIG. 2 shows the current levels that corresponds to each step code outputted from the first current output circuit 110 and the second current output circuit 120 according to a particular switching sequence in some embodiment, and FIG. 3 shows the integral non-linear curve INL1 of the first current output circuit 110 and the integral non-linear curve INL2 of the second current output circuit 120 according to the same particular switching sequence as in FIG. 2 in some embodiments.

In FIG. 2, the dashed line indicates current levels outputted by the first current output circuit 110 corresponding to each step code; the dotted line indicates current levels outputted by the second current output circuit 120 corresponding to each step code; whereas the solid line indicates the target current values that should be outputted by the first current output circuit 110 and the second current output circuit 120 corresponding to each step code in an ideal condition. In FIG. 2, the target current values of the first current sources CSA1 to CSAN are the same as target current values of the second current sources CSB1 to CSBN; however, the present disclosure is not limited thereto.

In FIG. 2, the first current output circuit 110 sequentially enables the first current sources CSAN, CSA(N−1), . . . to CSA3, CSA2, CSA1 for each step code, thereby increasing the total level of the output current gradually. In such case, the difference between the total current level outputted from the first current output circuit 110 for each step code and the current value should be outputted for each step code under the ideal condition would gradually increase in a positive direction and then gradually decrease, as shown in the integral non-linear curve INL1 in FIG. 3. On the contrary, the second current output circuit 120 sequentially enables the second current sources CSB1, CSB2, CSB3 . . . to CSBN for each step code, to gradually increase the total level of the output current. Thus, the difference between the total current level outputted from the second current output circuit 120 for each step code and the current value should be outputted for each step code under the ideal condition would gradually increase in a negative direction and then gradually decrease, as shown in the integral non-linear curve INL2 in FIG. 3

According to FIG. 3, under a particular switching sequence, the integral non-linear curve INL1 of the first current output circuit 110 and the integral non-linear curve INL2 of the second current output circuit 120 tend to change in the opposite direction. In other words, as the step code changes, the difference between the total currents outputted from the first current output circuit 110 and the second current output circuit 120 will also increase or decrease, resulting in a mismatch. In certain embodiments, the first current output circuit 110 and the second current output circuit 120 can be applied in different but related circuits; for example, the first current output circuit 110 can be applied in a digital-to-analog converting circuit at the signal transceiving terminal, the second current output circuit 120 can be applied in a digital-to-analog converting circuit in an echo canceller. In such case, if the signal transceiving terminal uses the first current output circuit 110 to generate the signal output, and the echo canceller uses the second current output circuit 120 to generate the echo compensation signal, then even though the echo canceller can detect the echo noise accurately, the effect of the echo compensation signal generated by the second current output circuit 120 would be quite unstable, thereby resulting in overcompensation or undercompesnation. In such case, not only the echo noise cannot be eliminated effectively, but additional uncontrollable noise may also be generated.

Figure 4:
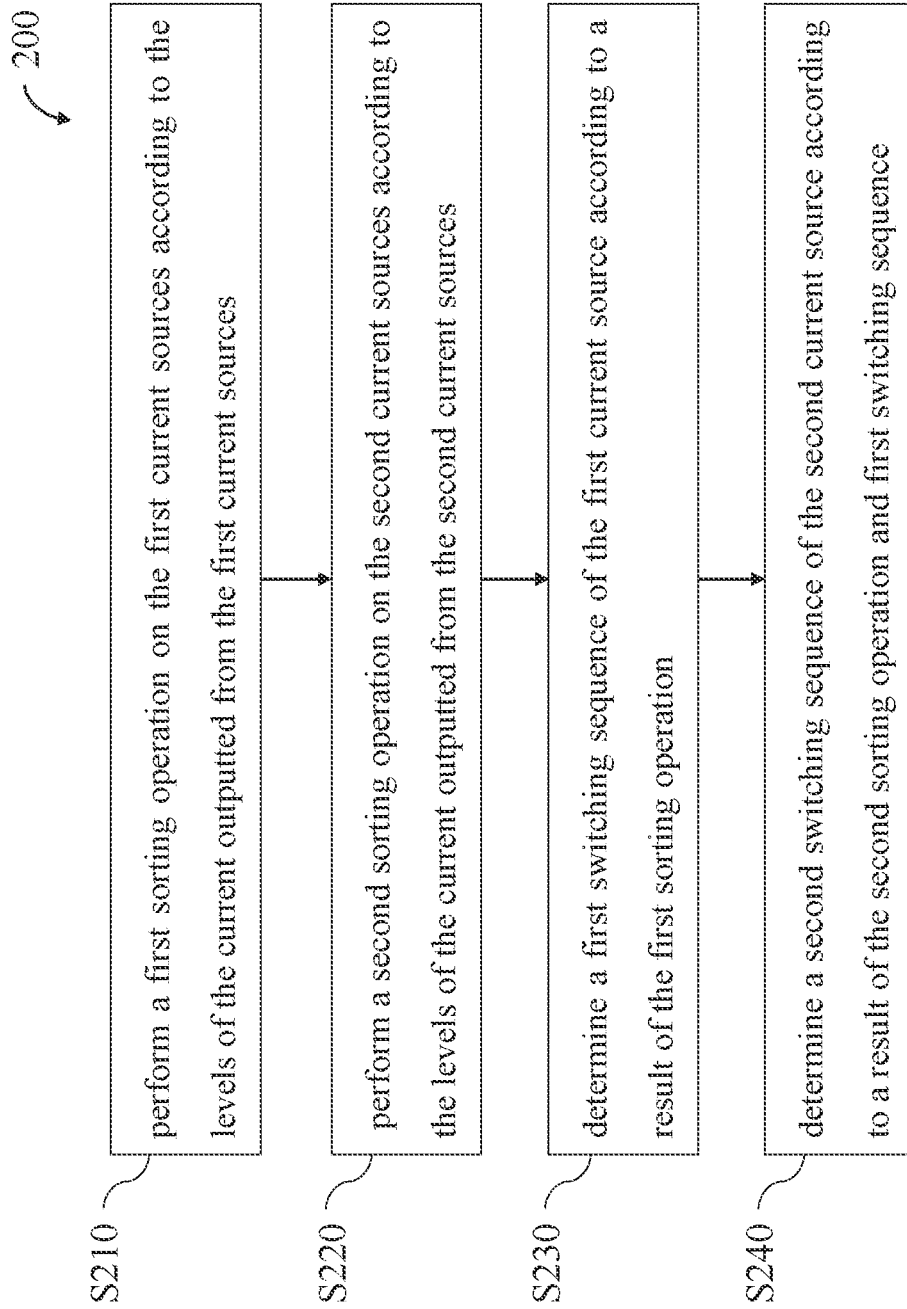
FIG. 4 is a flowchart illustrating a calibrating output current method according to one embodiment of the present disclosure.

To address the above-mentioned issue, the control circuit 130 can control the switching sequences of the current sources in the first current output circuit 110 and the second current output circuit 120, thereby allowing the currents outputted from the first current output circuit 110 and the second current output circuit 120 to match. FIG. 4 is a flowchart illustrating a calibrating output current method 200 according to one embodiment of the present disclosure. In certain embodiments, the method 200 can be applied in the current control system 100. The method 200 can include Steps S210 to S240.

S210: perform a first sorting operation on the first current sources CSA1 to CSAN according to the levels of the current outputted from the first current sources CSA1 to CSAN;

S220: perform a second sorting operation on the second current sources CSB1 to CSBN according to the levels of the current outputted from the second current sources CSB1 to CSBN;

S230: determine a first switching sequence of the first current source CSA1 to CSAN according to a result of the first sorting operation; and S240: determine a second switching sequence of the second current source CSB1 to CSBN according to a result of the second sorting operation and first switching sequence.

In the present embodiment, although the first current sources CSA1 to CSAN and the second current sources CSB1 to CSBN are numbered sequentially in the order of current levels outputted therefrom, in an actual application setting of the current control system 100, the level of the current outputted from each current source in first current output circuit 110 and the second current output circuit 120 is unknown and unpredictable. Hence, in Steps S210 and S220, the control circuit 130 first performs the first sorting operation upon the first current sources CSA1 to CSAN and performs the second sorting operation upon the second current sources CSB1 to CSBN. Next, in Step S230, the control circuit 130 determines the switching sequence of the first current sources CSA1 to CSAN according to the result of the first sorting operation, and in Step S240, determines the switching sequence of the second current sources CSB1 to CSBN according to the result of the second sorting operation and the first current sources CSA1 to CSAN.

In certain embodiments, the control circuit 130 can arbitrarily determine the switching sequence of the first current sources CSA1 to CSAN and sort the currents outputted from the first current sources CSA1 to CSAN according to the current levels, and then applies the corresponding switching priority to the second current sources CSB1 to CSBN. Consequently, the integral non-linear curve of the first current output circuit 110 and the integral non-linear curve of the second current output circuit 120 would have very similar changing trends, thereby increasing the matching level between the first current output circuit 110 and the second current output circuit 120.

For example, in a first sub-embodiment of the present disclosure, in Step S230, the control circuit 130 can allow a first median current source (which has a current that is ranked as the median among the first current sources CSA1 to CSAN) to have the first switching priority; and use the first median current source as a reference to set the switching priorities of other first current sources symmetrically. To facilitate understanding, the first sub-embodiment is discussed below using an example of N=7. In such case, the control circuit 130 can set the first median current source CSA4 having a current level ranked as the median among the first current sources CSA1 to CSA7 to have the first switching priority. Further, the control circuit 130 can allow the first current source CSA5, which has an output current level that is closest to and greater than the current outputted from the first median current source CSA4, to have a second switching priority, and allow the first current source CSA3, which has an output current level that is closest to and smaller than the current outputted from the first median current source CSA4, to have a third switching priority, and so on. In other words, the first current output circuit 110 would enable the first current sources CSA1 to CSA7 in the order of first current sources CSA4, CSA5, CSA3, CSA6, CSA2, CSA7, and CSA1. Consequently, during the gradual increase of the step current, the error value of the first current source CSA5 that is greater than the first target current can compensate with the error value of the first current source CSA3 that is smaller than the first target current, and the error value of the first current source CSA6 that is greater than the first target current can compensate with the error value of the first current source CSA2 that is smaller than the first target current so that the non-linear error value of the integration of the first current output circuit 110 can be suppressed and will not continue to accumulate.

Similarly, the control circuit 130 can set the second median current source CSB4, which has a current level ranked as the median among the second current sources CSB1 to CSB7, to have the first switching priority, according to the result of the second sorting operation and the switching sequence of the first current sources CSA1 to CSA7. Next, the control circuit 130 can allow the second current source CSB5, which has an output current level that is closest to and greater than the current outputted from the second median current source CSB4, to have the second switching priority, and allow the second current source CSB3, which has an output current level that is closest to and smaller than the current outputted from the second median current source CSB4, to have the third switching priority, and so on. In other words, the second current output circuit 120 would enable the second current sources CSB1 to CSB7 in the order of second current sources CSB4, CSB5, CSB3, CSB6, CSB2, CSB7, and CSB1. Consequently, during the gradual increase of the step current, the error value of the second current source CSB5 that is greater than the second target current can compensate with the error value of the second current source CSB3 that is smaller than the second target current, and the error value of the second current source CSB6 that is greater than the second target current can compensate with the error value of the second current source CSB2 that is smaller than the second target current so that the non-linear error value of the integration of the second current output circuit 120 can be suppressed.

Further, in certain embodiments, the first current output circuit 110 can enable the first current sources CSA1 to CSA7 in the order of first current sources CSA4, CSA3, CSA5, CSA2, CSA6, CSA1, and CSA7, whereas the second current output circuit 120 can enable the second current sources CSB1 to CSB7 correspondingly in the order of second current sources CSB4, CSB3, CSB5, CSB2, CSB6, CSB1, and CSB7.

Figure 5:
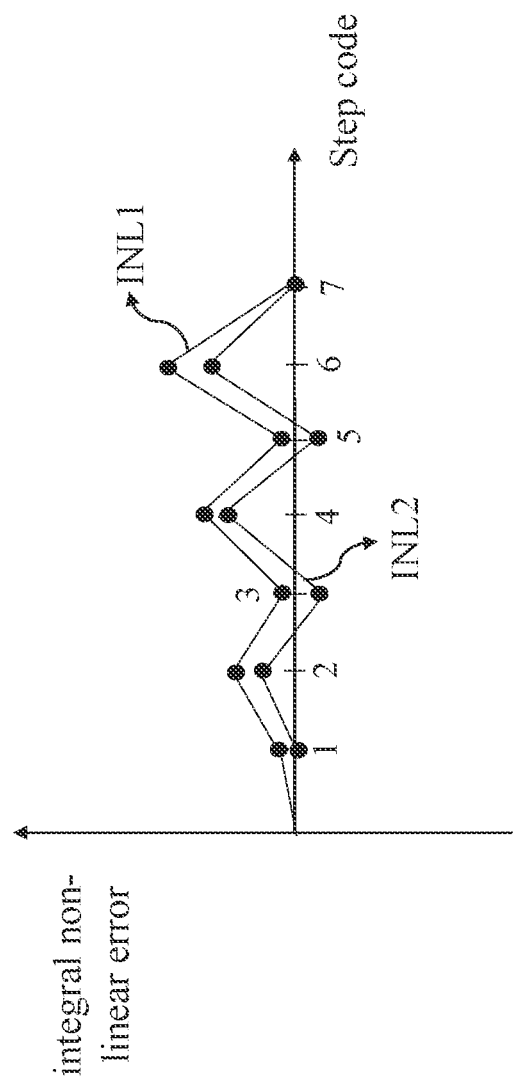
FIG. 5 shows the integral non-linear curve of the first current output circuit and the integral non-linear curve of the second current output circuit according to the first sub-embodiment.

FIG. 5 shows the integral non-linear curve INL1 of the first current output circuit 110 and the integral non-linear curve INL2 of the second current output circuit 120 according to the first sub-embodiment. In FIG. 5, although the error level among the first current sources CSA1 to CSA7 may differ from the error level among the second current sources CSB1 to CSB7, the integral non-linear curve of the first current output circuit 110 and the integral non-linear curve of the second current output circuit 120 would have similar changing trends by using the method 200, thereby increasing the matching level between the first current output circuit 110 and the second current output circuit 120.

In the first sub-embodiment, the control circuit 130 uses the first median current source as a reference and sets the switching priority of each first current source symmetrically; however, the present disclosure is not limited thereto. In some other embodiments, the control circuit 130 can also determine the switching priority of each current source according to other rules. For example, in the second sub-embodiment of the present disclosure, after the control circuit 130 allows the first median current source CSA4 to have a first switching priority, it sets the switching priorities of the first current sources CSA5 to CSA7 that have output currents greater than the current outputted from the first median current source CSA4 according to their current levels in ascending order. Next, for the other first current sources CSA1 to CSA3, the control circuit 130 can sequentially set the switching priorities of the first current sources CSA1 to CSA3 according to their current levels in ascending order. In other words, the first current output circuit 110 would enable the first current sources CSA1 to CSA7 in the order of first current sources CSA4, CSA5, CSA6, CSA7, CSA1, CSA2, and CSA3.

Similarly, the control circuit 130 can determine the switching priorities of the second current sources following the same rule. For example, after the control circuit 130 allows the second median current source CSB4 to have the first switching priority, it may set switching priorities of the second current sources CSB5 to CSB7 that have output currents greater than the current outputted from the second median current source CSB4 according to their current levels in ascending order. Next, for the other second current sources CSB1 to CSB3, the control circuit 130 can sequentially set, the switching priorities of the second current sources CSB1 to CSB3 according to their current levels in ascending order. In other words, the second current output circuit 120 would enable the second current sources CSB1 to CSB7 in the order of second current sources CSB4, CSB5, CSB6, CSB7, CSB1, CSB2, and CSB3.

Figure 6:
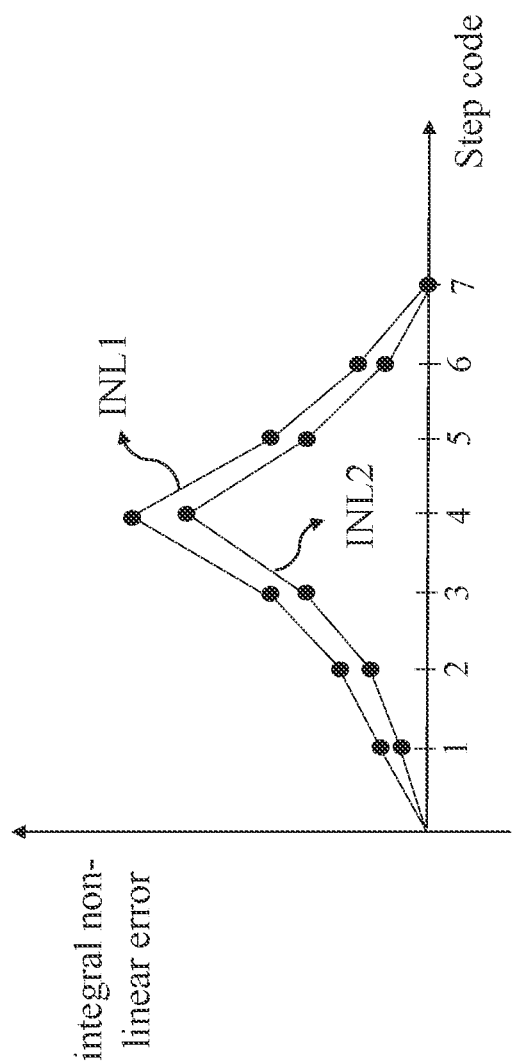
FIG. 6 shows the integral non-linear curve of the first current output circuit and the integral non-linear curve of the second current output circuit according to the second sub-embodiment.

FIG. 6 shows the integral non-linear curve INL1 of the first current output circuit 110 and the integral non-linear curve INL2 of the second current output circuit 120 according to the second sub-embodiment. In FIG. 6, the integral non-linear curve of the first current output circuit 110 first increases gradually and then decreases gradually, and the integral non-linear curve of the second current output circuit 120 has a similar changing trend, thereby increasing the matching level between the first current output circuit 110 and the second current output circuit 120.

In some embodiments, the control circuit 130 can also set the switching priorities of the first current sources CSA5 to CSA7 after the switching priorities of the first current sources CSA1 to CSA3 and set the switching priorities of the second current sources CSB5 to CSB7 after the switching priorities of the second current sources CSB1 to CSB3. For example, in the third sub-embodiment of the present disclosure, after the control circuit 130 allows the first median current source CSA4 to have the first switching priority, it can set the switching priorities of the first current sources CSA1 to CSA3 that have output currents smaller than the current outputted from the first median current source CSA4 according to their current levels in descending order. Next, for the other first current sources CSA5 to CSA7, the control circuit 130 can sequentially set the switching priorities of the first current sources CSA5 to CSA7 according to their current levels in descending order. In other words, the first current output circuit 110 would enable the first current sources CSA1 to CSA7 in the order of first current sources CSA4, CSA3, CSA2, CSA1, CSA7, CSA6, and CSA5.

Similarly, the second current output circuit 120 would enable the second current sources CSB1 to CSB7 in the order of second current sources CSB4, CSB3, CSB2, CSB1, CSB7, CSB0, and CSB5.

Figure 7:
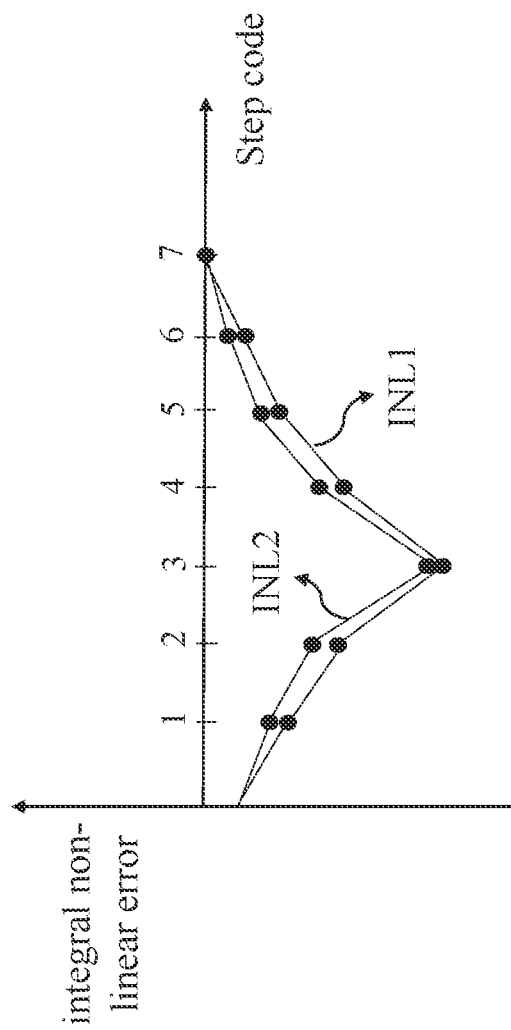
FIG. 7 shows the integral non-linear curve of the first current output circuit and the integral non-linear curve of the second current output circuit according to the second sub-embodiment.

FIG. 7 shows the integral non-linear curve INL1 of the first current output circuit 110 and the integral non-linear curve INL2 of the second current output circuit 120 according to the second sub-embodiment. In FIG. 7, the integral non-linear curve of the first current output circuit 110 first decreases gradually and then increases gradually, and the integral non-linear curve of the second current output circuit 120 has a similar changing trend, thereby increasing the matching level between the first current output circuit 110 and the second current output circuit 120. In other words, the control circuit 130 can determine the switching sequences of the first current sources CSA1 to CSA7 following different rules depending on the need, as long as the control circuit 130 follows a similar rule to determine the switching sequences of the second current sources CSB1 to CSB7 after the switching sequences of the first current sources CSA1 to CSA7 are determined, so that the integral non-linear curves of the first current output circuit 110 and the second current output circuit 120 would have similar changing trends, thereby increasing the matching level between the first current output circuit 110 and the second current output circuit 120.

Figure 8:
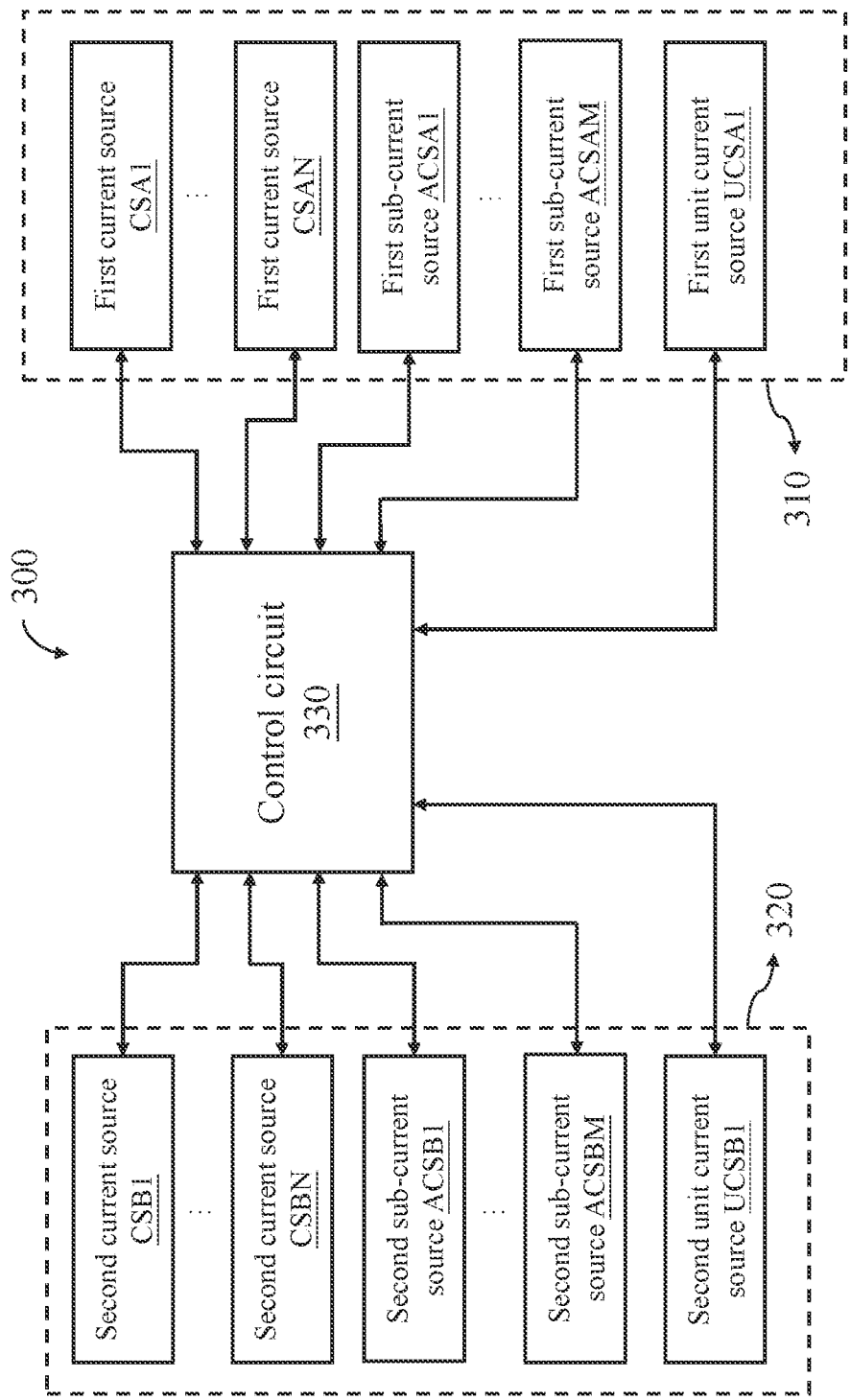
FIG. 8 is a schematic diagram illustrating a current control system according to one embodiment of the present disclosure.

FIG. 8 is a schematic diagram illustrating a current control system 300 according to one embodiment of the present disclosure. The current control system 300 can include a first current output circuit 310, a second current output circuit 320, and a control circuit 330. The current control system 300 has a structure similar to that of the current control system 100 of FIG. 1 and can also be operated according to the method 200; however, in the current control system 300, the first current output circuit 310 can further include first sub-current sources ACSA1 to ACSAM and a first unit current source CSA1, whereas the second current output circuit 320 can further include second sub-current sources ACSB1 to ACSBM and a second unit current source UCSB1, wherein M is an integer greater than 1.

In the present embodiment, the first sub-current sources ACSA1 to ACSAM and the second sub-current sources ACSB1 to ACSBM are used to provide more steps of the step current. For example, target current values of the first sub-current sources ACSA1, to ACSAM can be smaller than the target current value of the first current source CSA1, whereas target current values of the second sub-current sources ACSB1 to ACSBM can be smaller than the target current value of the second current source CSB1. Consequently, the first current output circuit 310 and the second current output circuit 320 can use the first sub-current sources ACSA1 to ACSAM and the second sub-current sources ACSB1 to ACSBM to provide smaller step currents.

Moreover, in some embodiments, to comply with the step code used by the current control system 300, the first sub-current sources ACSA1 to ACSAM and the first unit current source UCSA1 may have the same sub-target current value, and the target current value of the first reference current that outputted from the first sub-current sources ACSA1 to ACSAM and the first unit current source UCSA1 jointly may be equal to the first target current value of each of the first current sources CSA1 to CSAN. Similarly, the second sub-current sources ACSB1 to ACSBM and the second unit current source UCSB1 may have the same sub-target current value, and the target current value of second reference current that outputted from the second sub-current sources ACSB1 to ACSBM and the second unit current source UCSB1 jointly may be equal to the second target current value of the second current sources CSB1 to CSBN. For example, if M=7, then the first target current value of the first current source CSA1 can be 8 times that of the first sub-current source ACSA1 (that is, the first target current value of a current source CSA1 is 8 times the unit current). Hence, if the first sub-current sources ACSA1 to ACSAM are all enabled when the step code is 7, then the first sub-current sources ACSA1 to ACSAM can be all disabled while one of the first current sources CSA1 to CSAN is enabled when the step code is 8 so as to continuously increase the output current and maintain the linearity of the step current. In other words, in the first current output circuit 310, the first current sources CSA1 to CSAN can be used to provide the current of the highest significant bit, and the first sub-current sources ACSA1 to ACSAM can be used to provide the current of the lowest significant bit. Similarly, in the second current output circuit 320, the second current sources CSB1 to CSBN can be used to provide the current of the highest significant bit, and the second sub-current sources ACSB1 to ACSBM can be used to provide the current of the lowest significant bit.

In the present embodiment, since the first current output circuit 310 switches between the first current sources CSA1 to CSAN and the first sub-current sources ACSA1 to ACSAM when gradually increasing the step current, the selection of the first switching sequence of the first current sources CSA1 to CSAN will affect the non-linear error value of the integration generated during the switching process. For example, if the total level of currents outputted from the first sub-current sources ACSA1 to ACSAM is smaller than the total target current, but the current output from the first current source with the first switching priority in the first current sources CSA1 to CSAN is greater than the first target current, then a large jump is generated between two current steps when the first sub-current sources ACSA1 to ACSAM are changed from all-enabled to all-disabled, and the first current source with the first switching priority is changed from disabled to enabled to increase the output current. In contrast, if the total level of currents outputted from the second sub-current sources ACSB1 to ACSBM is greater than the total target current, but the current outputted from the first current source with the first switching priority among the second current sources CSB1 to CSBN is smaller than the first target current, then a relatively insignificant jump is generated between two current steps when the second sub-current sources ACSB1 to ACSBM are changed from all-enabled to all-disabled and the second current source with the first switching priority is changed from disabled to enabled to increase the output current. Since the current jumps generated by the first current output circuit 310 and the second current output circuit 320 are quite different when the output current is stepped up, the non-linear error of the integration of the first current output circuit 310 and the second current output circuit 320 tends to be different, resulting in a situation where the current output by the first current output circuit 310 and the second current output circuit 320 does not match.

In such case, the method 200 can allow the first sub-current sources ACSA1 to ACSAM and the first unit current source UCSA1 to jointly generate a first reference current, and in the first sorting operation in Step S210, the first reference current and the currents outputted from the first current sources CSA1 to CSAN are sorted together. Similarly, the method 200 can allow the second sub-current sources ACSB1 to ACSBM and the second unit current source UCSB1 to jointly generate a second reference current, and in the second sorting operation in Step S220, the second reference current and the currents outputted from the second current sources CSB1 to CSBN are sorted together.

Next, in Step S230, the control circuit 330 uses the first reference current as a reference to determine the switching sequence of the first current sources CSA1 to CSAN, and in Step S240, the control circuit 330 uses the second reference current as a reference according to the result of the second sorting operation and determines the switching sequence of the second current sources CSB1 to CSBN according to the switching sequence of the first current sources CSA1 to CSAN.

For example, if N=7 and the first reference current is greater than the current outputted from the first current source CSA4 and smaller than the current outputted from the first current source CSA5, then in Step S230, the control circuit 330 can allow the first current source CSA5 having an output current level that is closest to and greater than the first reference current to have the first switching priority, allow the first current source CSA4 having an output current level that is closest to and smaller than the first reference current to have the second switching priority, and so on. In such case, the first current output circuit 310 can enable the first current sources CSA1 to CSA7 in the order of first current sources CSA5, CSA4, CSA6, CSA3, CSA7, CSA2, and CSA1.

Next, in Step S240, if the second reference current is greater than the current outputted from the second current sources CSB3 and smaller than the current outputted from the second current sources CSB4, then the control circuit 330 can allow the second current source CSB4 having an output current level that is closest to and greater than the second reference current to have the first switching priority, and allow the second current source CSB3 having an output current level that is closest to and smaller than the second reference current to have the second switching priority, and so on. In such case, the second current output circuit 320 can enable the second current sources CSB1 to CSB7 in the order of second current sources CSB4, CSB3, CSB5, CSB2, CSBG, CSB1, and CSB7.

Consequently, when the first current output circuit 310 switches between the first current sources CSA1 to CSAN and the first sub-current sources ACSA1 to ACSAM and when the second current output circuit 320 switches between the second current sources CSB1 to CSBN and the second sub-current sources ACSB1 to ACSBM, integral non-linear curves of the first current output circuit 310 and the second current output circuit 320 would have a more similar changing trend, thereby increasing the matching level between the first current output circuit 310 and the second current output circuit 320.

In the foregoing embodiment, the control circuit 330 uses the first reference current as the reference and sets the switching priority of each of the first current sources CSA1 to CSA7 in a symmetrical way; however, the present disclosure is not limited thereto. In some other embodiments, the control circuit 330 can use the first reference current as the reference and determine the switching priority of each current source according to other rules. For example, for the first current sources CSA5 to CSA7 having an output current greater than the first reference current among the first current sources CSA1 to CSA7, the control circuit 330 can set the switching priority of the first current sources CSA5 to CSA7 according to their current levels in ascending order, whereas for the other first current sources CSA1 to CSA4, the control circuit 330 can set the switching priorities of the first current sources CSA1 to CSA4 according to their current levels in ascending order. In other words, the first current output circuit 310 would enable the first current sources CSA1 to CSA7 in the order of first current sources CSA5, CSA6, CSA7, CSA1 CSA2, CSA3, and CSA4.

Similarly, for the second current sources CSB4 to CSB7 having an output current greater than second reference current among the second current sources CSB1 to CSB7, the control circuit 330 can set the switching priority of the second current sources CSB4 to CSB7 according to their current levels in ascending order, whereas for the other second current sources CSB1 to CSB3, the control circuit 330 can set the switching priorities of the second current sources CSB1 to CSB3 according to their current levels in ascending order. In other words, the second current output circuit 310 would enable the second current sources CSB1 to CSB7 in the order of second current sources CSB4, CSB5, CSB6, CSB7, CSB1, CSB2, and CSB3. In such case, the integral non-linear curve of the first current output circuit 310 would first increase gradually and then decrease gradually, whereas the integral non-linear curve of the second current output circuit 320 would have a similar changing trend, thereby increasing the matching level between the first current output circuit 310 and the second current output circuit 320.

However, in some other embodiments, for the first current sources CSA1 to CSA4 having an output current that is smaller than the first reference current among the first current sources CSA1 to CSA7, the control circuit 330 can set the switching priorities of the first current sources CSA1 to CSA according to their current levels in descending order, and for the other first current sources CSA5 to CSA7, the control circuit 330 can sequentially set switching priorities of the first current sources CSA5 to CSA7 according to their current levels in descending order. In other words, the first current output circuit 310 will enable the first current sources CSA1 to CSA7 in the order of first current sources CSA4, CSA3, CSA2, CSA1, CSA7, CSA0, and CSA5.

Similarly, for the second current sources CSB1 to CSB3 having an output current that is smaller than the second reference current among the second current sources CSB1 to CSB7, the control circuit 330 can set the switching priorities of the second current sources CSB1 to CSB3 according to their current levels in descending order, and for the other second current sources CSB4 to CSB7, the control circuit 330 can sequentially set switching priorities of the second current sources CSB4 to CSB7 according to their current levels in descending order. In other words, the second current output circuit 310 will enable the second current sources CSB1 to CSB7 in the order of second current sources CSB3, CSB2, CSB1, CSB7, CSB6, CSB5, and CSB4. In such case, the integral non-linear curve of the first current output circuit 310 would first decrease gradually and then increase gradually, whereas the integral non-linear curve of the second current output circuit 320 would have a similar changing trend, thereby increasing the matching level between the first current output circuit 310 and the second current output circuit 320.

Figure 9:
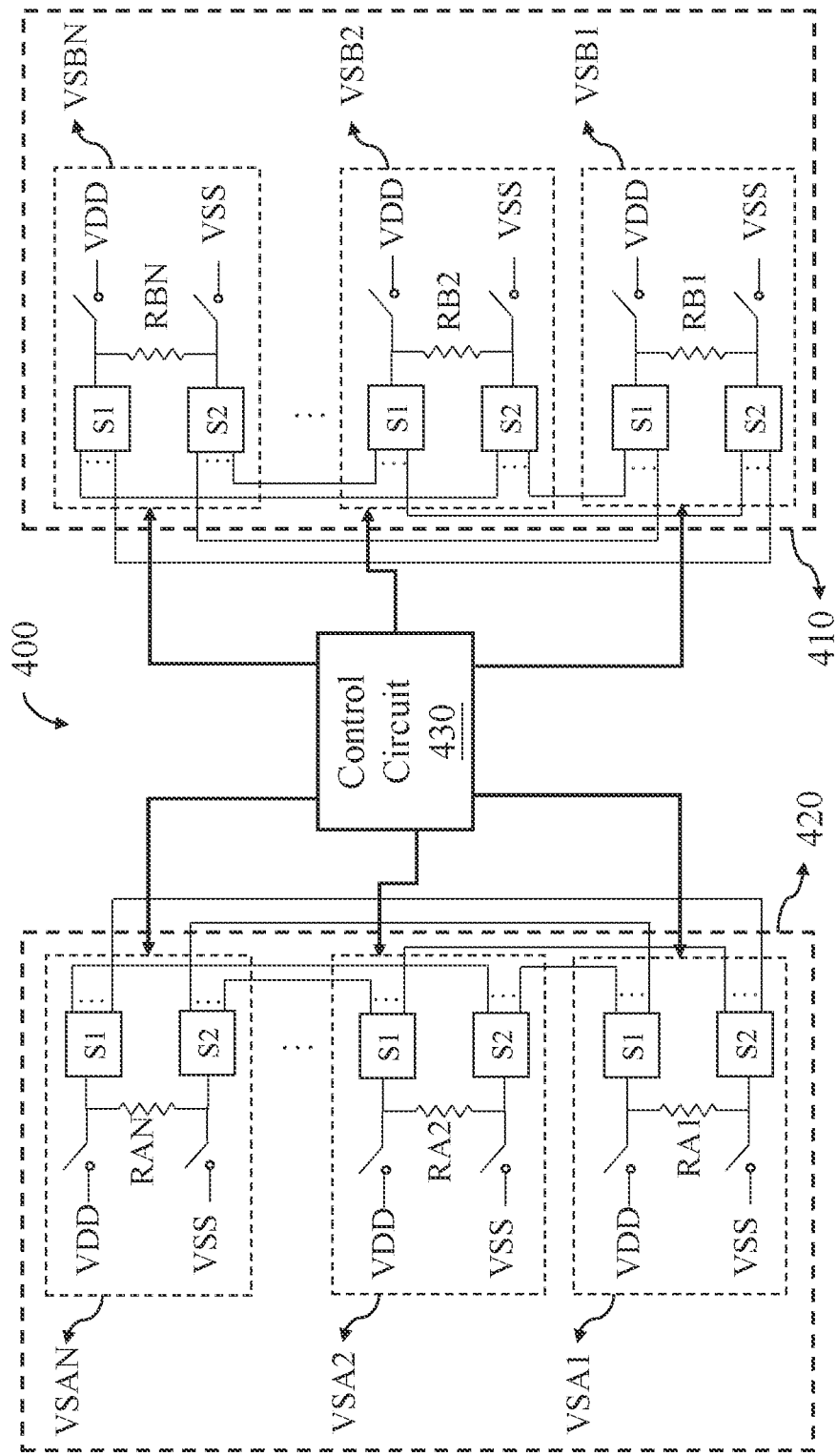
FIG. 9 is a schematic diagram illustrating a voltage control system according to one embodiment of the present disclosure.

In addition, the operating principle of the current control system 100 in the preceding embodiment for controlling the first current output circuit 110 and the second current output circuit 120 can also be applied in a voltage output circuit. FIG. 9 is a schematic diagram illustrating a voltage control system 400 according to one embodiment of the present disclosure. The voltage control system 400 may comprise a first voltage output circuit 410, a second voltage output circuit 420, and a controller 430 coupled to the first voltage output circuit 410 and the second voltage output circuit 420.

In the present embodiment, the first voltage output circuit 410 can include N first voltage divider units VSA1 to VSAN (some of them are omitted in the drawings), and the second voltage output circuit 420 can include N second voltage divider units VSB1 to VSBN (some of them are omitted in the drawings), wherein N is an integer greater than 1. Although the first voltage divider units VSA1 to VSAN have the same target divided voltage, errors caused during the manufacturing processes will make the actual divided voltages generated by the first voltage divider units VSA1 to VSAN deviate from the target divided voltage level to different degrees. Similarly, although the second voltage divider units VSB1 to VSBN have the same target divided voltage level, errors caused during the manufacturing processes will make the actual divided voltages generated by the second voltage divider units VSB1 to VSBN deviate from the target divided voltage level to different degrees.

In FIG. 9, each of the first voltage divider units VSA1 to VSAN and each of the second voltage divider units VSB1 to VSBN may have the same structure. For example, the first voltage divider unit VSA1 can include a voltage-dividing resistor RA1 and is coupled to the other first voltage divider unit VSA2 to VSAN via switch circuits S1 and S2. Further, the two terminals of the voltage-dividing resistor RA1 can be selectively coupled to the operating voltage VDD and the voltage VSS via the switches. In such case, the controller 430 can control whether the first voltage divider units VSA1 to VSAN should be connected to the operating voltage VDD and the voltage VSS, and can control the switch circuits S1 and S2 to set the series connection sequence of the voltage-dividing resistors RA1 to RAN in the first voltage divider units VSA1 to VSAN between the operating voltage VDD and the voltage VSS, thereby allowing the first voltage divider units VSA to VSAN to provide the step divided voltage in the desired order. For example, the controller 430 can allow the voltage-dividing resistor RAN to receive the operating voltage VDD and allow the voltage-dividing resistor RA1 to receive the voltage VSS, and control switch circuits S1 and S2 of the first voltage divider units VSA1 to VSAN, thereby allowing the voltage-dividing resistors RA1 to RAN to be serially connected in the order of RA1, RA2, RA3, . . . and RAN. Consequently, the first voltage divider unit VSA1 would have the first series connection position, and the two terminals of the voltage-dividing resistor RA1 can be used to provide the first step voltage, whereas the first voltage divider unit VSA2 would have the second series connection position, and the two terminals of the voltage-dividing resistor RA2 can be used to provide the second step voltage, and so on.

However, the controller 430 can allow the voltage-dividing resistor RAN to receive the operating voltage VSS and allow the voltage-dividing resistor RA1 to receive the operating voltage VDD and control switch circuits S1 and S2 of the first voltage divider units VSA1 to VSAN, thereby allowing the voltage-dividing resistors RA1 to RAN to be serially connected in the order of RAN, RA2, . . . RA1. Consequently, the first voltage divider unit VSAN would have the first series connection position, whereas the two terminals of the voltage-dividing resistor RAN can be sued to provide the first step voltage, and the first voltage divider unit VSA2 would have the second series connection position, whereas the two terminals of the voltage-dividing resistor RA2 can be used to provide the second step voltage, and so on. In such case, the first voltage divider unit VSA1 would have the Nth series connection position, whereas the two terminals of the voltage-dividing resistor RA1 can be used to provide the Nth step voltage.

Similarly, the controller 430 can control whether the second voltage divider units VSB1 to VSBN should be connected to the operating voltage VDD and the voltage VSS, and can control the switch circuits S1 and S2 to set the series connection sequence of the voltage-dividing resistors RB1 to RBN in the second voltage divider units VSB1 to VSBN between the operating voltage VDD and the voltage VSS, thereby allowing the second voltage divider units VSB1 to VSBN to provide the step divided voltage in a desired order.

Although the voltage-dividing resistors RA1 to RAN have the same target resistance, the voltage-dividing resistors RA1 to RAN may still differ from one another; therefore, the actual divided voltage provided by the first voltage divider units VSA1 to VSAN may differ. Similarly, the divided voltage provided by each of the second voltage divider units VSB1 to VSBN may also differ.

In such case, the series connection sequence of the first voltage divider units VSA1 to VSAN in the first voltage output circuit 410 and the series connection sequence of the second voltage divider units VSB1 to VSBN in the second voltage output circuit 420 would affect the matching degree when the two output the voltage. For the convenience of understanding, in the present embodiment, the first voltage divider units VSA1 to VSAN are numbered in ascending order of the divided voltage outputted thereby. In other words, the divided voltage outputted from the first voltage divider unit VSA2 is greater than the divided voltage outputted from the first voltage divider unit VSA1, the divided voltage outputted from the first voltage divider unit VSA3 is greater than the divided voltage outputted from the first voltage divider unit VSA2, and the divided voltage outputted from the first voltage divider unit VSAN is greater than the divided voltage outputted from all the above-mentioned first voltage divider units VSA1 to VSA(N−1) (omitted in the drawings). Similarly, the second voltage divider units VSB1 to VSBN are also numbered in ascending order of the divided voltage outputted thereby.

After the control circuit 430 performs a first sorting operation on first voltage divider units VSA1 to VSAN according to divided voltage levels outputted from first voltage divider units VSA1 to VSAN, it can determine a first series connection sequence of first voltage divider units VSA1 to VSAN according to a result of the first sorting operation. Further, the control circuit 430 can perform a second sorting operation on second voltage divider units VSB1 to VSBN according to divided voltage levels outputted from second voltage divider units VSB1 to VSBN, and then determine a second series connection sequence of second voltage divider units VSB1 to VSBN according to a result of the second sorting operation and the first series connection sequence.

In the fourth sub-embodiment of the present disclosure, if N=7, then the control circuit 430 can set the first median divide unit VSA4 having a divided voltage level ranked as the median among the first divide units VSA1 to VSA7 to have the first series connection position. Further, the control circuit 430 can allow the first divide unit VSA5, which has an output divided voltage level that is closest to and greater than the divided voltage outputted from the first median divide unit VSA4, to have a second series connection position, and allow the first divide unit VSA3, which has an output divided voltage level that is closest to and smaller than the divided voltage outputted from the first median divide unit VSA4, to have a third series connection position, and so on. In other words, the first voltage output circuit 410 will connect the first divide units VSA1 to VSA7 in series in the order of first divide units VSA4, VSA5, VSA3, VSA2, VSA7, and VSA1. Consequently, during the gradual increase of the step voltage, first voltage divider units VSA4, VSA5, VSA3, VSA6, VSA2, VSA7, and VSA1 would provide divided voltage in series, so that the error value of the first divide unit VSA5 that is greater than the first target divided voltage can compensate with the error value of the first divide unit VSA3 that is smaller than the first target current, and the error value of the first divide unit VSA6 that is greater than the first target divided voltage can compensate with the error value of the first divide unit VSA2 that is smaller than the first target current, and hence the non-linear error value of the integration of the first voltage output circuit 410 can be suppressed and will not continue to accumulate.

Similarly, the control circuit 430 can set the second median voltage divider unit VSB4, which has a divided voltage level ranked as the median among the second voltage divider units VSB1 to VSB7, to have the first series connection position, according to the result of the second sorting operation and the switching sequence of the first voltage divider units VSA1 to VSA7. Next, the control circuit 430 can allow the second voltage divider unit VSB5, which has an output divided voltage level that is closest to and greater than the divided voltage outputted from the second median voltage divider unit VSB4, to have the second series connection position, and allow the second voltage divider unit VSB3, which has an output divided voltage level that is closest to and smaller than the divided voltage outputted from the second median voltage divider unit VSB4, to have the third series connection position, and so on. In other words, the second voltage output circuit 420 would connect the second voltage divider units VSB1 to VSB7 in series in the order of second voltage divider units VSB4, VSB5, VSB3, VSB6, VSB2, VSB7, and VSB1. Consequently, during the gradual increase of the step voltage, the error value of the second voltage divider unit VSB5 that is greater than the second target divided voltage can compensate with the error value of the second voltage divider unit VSB3 that is smaller than the second target current, and the error value of the second voltage divider unit VSB6 that is greater than the second target divided voltage can compensate with the error value of the second voltage divider unit VSB2 that is smaller than the second target current so that the non-linear error value of the integration of the second voltage output circuit 420 can be suppressed.

In the fourth sub-embodiment, the integral non-linear curve of the first voltage output circuit 410 is similar to the integral non-linear curve of the second voltage output circuit 420. In other words, using the foregoing operating method, the voltage output system 400 can allow the integral non-linear curve of the first voltage output circuit 410 and the integral non-linear curve of the second voltage output circuit 420 to have similar changing trends, thereby increasing the matching degree between the first voltage output circuit 410 and the second voltage output circuit 420. Further, in some embodiments, the first voltage output circuit 410 can connect first voltage divider units VSA1 to VSA7 in serial in the order of first voltage divider units VSA4, VSA3, VSA5, VSA2, VSA6, VSA1, and VSA7, whereas the second voltage output circuit 120 can connect second voltage divider units VSB1 to VSB7 in series in the order of second voltage divider units VSB4, VSB3, VSB5, VSB2, VSB6, VSB1, and VSB7.

In the fourth embodiment, the control circuit 430 uses the first median voltage divider unit VS4 as the reference and sets the series connection position of each first voltage divider unit symmetrically; however, the present disclosure is not limited thereto. In some other embodiments, the control circuit 430 can also determine the series connection position of each voltage divider unit according to other rules. For example, in the fifth sub-embodiment of the present disclosure, after the control circuit 430 allows the first median voltage divider unit VSA4 to have the first series connection position, it sets the series connection positions of the first voltage divider units VSA5 to VSA7 that have output divided voltages greater than the divided voltage outputted from the first median voltage divider unit CSA4 according to their divided voltage levels in ascending order. Next, for the other first voltage divider units VSA1 to VSA3, the control circuit 430 can sequentially set the series connection positions of the first voltage divider units CSA1 to CSA3 according to their divided voltage levels in ascending order. In other words, the first voltage output circuit 410 would connect the first voltage divider units VSA1 to VSA7 in series in the order of first voltage divider units VSA4, VSA5, VSA6, VSA7, VSA1, VSA2, and VSA3.

Similarly, the control circuit 430 can determine the series connection positions of the second voltage divider units following the same rule. For example, after the control circuit 430 allows the second median voltage divider unit VSB4 to have the first series connection position, it may set the series connection positions of the second voltage divider units VSB5 to VSB7 that have output divided voltages greater than the divided voltage outputted according to their divided voltage levels in ascending order. Next, for the other second voltage divider units VSB1 to VSB3, the control circuit 430 can sequentially set the series connection positions of the second voltage divider units VSB1 to VSB3 according to their divided voltage levels in ascending order. In other words, the second voltage output circuit 420 would connect the second voltage divider units VSB1 to VSB7 in series in the order of second voltage divider units VSB4, VSB5, VSB6 VSB7, VSB1, VSB2, and VSB3.

In the fifth embodiment, the integral non-linear curve of the first voltage output circuit 410 and the integral non-linear curve of the second voltage output circuit 420 would have changing trends similar to those of the integral non-linear curve INL1 of the first current output circuit 110 and the integral non-linear curve INL2 of the second current output circuit 120 of FIG. 6. That is, the integral non-linear curve of the first voltage output circuit 410 and the integral non-linear curve of the second voltage output circuit 420 would have similar changing trends, thereby allowing the first voltage output circuit 410 and the second voltage output circuit 420 to match each other.

In some embodiments, the control circuit 430 can also arrange the series connection positions of first voltage divider units VSA5 to VSA7 to be after the series connection positions of first voltage divider units VSA1 to VSA3 and arrange the series connection positions of second voltage divider units VSB5 to VSB7 to be after the series connection positions of second voltage divider units VSB1 to VSB3. For example, in the sixth sub-embodiment of the present disclosure, after the control circuit 430 allows the first median voltage divider unit VSA4 to have the first series connection position, it sets series connection positions of first voltage divider units VSA1 to VSA3 that have divided voltages smaller than the divided voltage outputted from the first median voltage divider unit VSA4 according to their divided voltages in descending order. Next, the control circuit 430 can also set series connection positions of first voltage divider units VSA5 to VSA7 according to their divided voltages in descending order. In other words, the first voltage output circuit 410 would connect the first voltage divider units VSA1 to VSA7 in series in the order of first voltage divider units VSA4, VSA3, VSA2, VSA1, VSA7, VSA6, and VSA5. Similarly, the second voltage output circuit 420 would connect second voltage divider units VSB1 to VSB7 in series in the order of second voltage divider units VSB4, VSB3, VSB2, VSB1, VSB7, VSB6, and VSB5.

In the sixth embodiment, the integral non-linear curve of the first voltage output circuit 410 and the integral non-linear curve of the second voltage output circuit 420 would have changing trends similar to those of the integral non-linear curve INL1 of the first current output circuit 110 and the integral non-linear curve INL2 of the second current output circuit 120 of FIG. 7. That is, the integral non-linear curve of the first voltage output circuit 410 and the integral non-linear curve of the second voltage output circuit 420 would have similar changing trends, thereby allowing the first voltage output circuit 410 and the second voltage output circuit 420 to match each other.

In other words, the control circuit 430 can determine the series connection sequences of the first voltage divider units VSA1 to VSA7 following different rules depending on the need, as long as the control circuit 430 follows the similar rule to determine the series connection sequences of the second voltage divider units VSB1 to VSB7 after the series connection sequences of the first voltage divider units VSA1 to VSA7 are determined. The integral non-linear curves of the first voltage output circuit 410 and the second voltage output circuit 420 would have similar changing trends, thereby increasing the matching level between the first voltage output circuit 410 and the second voltage output circuit 420.

In view of the foregoing, the current control system and method for calibrating output currents according to embodiments of the present disclosure can perform sorting operations on current sources of two current output circuits, and first, determine the switching sequence of the current sources of one of the two current output circuits according to the result of the sorting operation, and then set the switching sequence of current sources of the other current output circuit, thereby allowing the two current output circuits to have integral non-linear curves with similar changing trends, so as to increase the matching degree between the two current output circuits.

What is claimed is:

1. A method for calibrating output current, comprising:
performing a first sorting operation on a plurality of first current sources according to current levels outputted by the plurality of first current sources;
performing a second sorting operation on a plurality of second current sources according to current levels outputted by the plurality of second current sources;
determining a first switching sequence of the plurality of first current sources according to a result of the first sorting operation; and
determining a second switching sequence of the plurality of second current sources according to a result of the second sorting operation and the first switching sequence, wherein:
each of the plurality of first current sources has a same first target current value; and
each of the plurality of second current sources has a same second target current value.

2. The method for calibrating output current of claim 1, further comprising:

allowing a plurality of first sub-current sources and a first unit current source to jointly generate a first reference current; and allowing a plurality of second sub-current sources and a second unit current source to jointly generate a second reference current, wherein:

a target current value of the first reference current is equal to the first target current value;

a target current value of the second reference current is equal to the second target current value;

the plurality of first sub-current sources and the first unit current source have a same first sub-target current value;

the plurality of second sub-current sources and the second unit current source have a same second sub-target current value;

the step of performing the first sorting operation on the plurality of first current sources according to the current levels outputted by the plurality of first current sources comprises: performing the first sorting operation on the plurality of first current sources according to the current levels outputted by the plurality of first current sources and the first reference current; and the step of performing the second sorting operation on the plurality of second current sources according to the current levels outputted by the plurality of second current sources comprises: performing the second sorting operation on the plurality of second current sources according to the current levels outputted by the plurality of second current sources and the second reference current.

3. The method for calibrating output current of claim 2, wherein:

the step of determining the first switching sequence of the plurality of first current sources according to the result of the first sorting operation comprises:

allowing a first current source having an output current level that is closest to and greater than the first reference current to have a first switching priority, and allowing a first current source having output current level that is closest to and smaller than the first reference current to have a second switching priority; or allowing the first current source having an output current level that is closest to and smaller than the first reference current to have the first switching priority, and allowing the first current source having an output current level that is closest to and greater than the first reference current to have the second switching priority; and the step of determining the second switching sequence of the plurality of second current sources according to the result of the second sorting operation and the first switching sequence comprises:

when the first current source having an output current level that is closest to and greater than the first reference current has the first switching priority, allowing a second current source having an output current level that is closest to and greater than the second reference current to have a first switching priority, and allowing a second current source having an output current level that is closest to and smaller than the second reference current to have a second switching priority; or when the first current source having an output current level that is closest to and smaller than the first reference current has the first switching priority, allowing the second current source having an output current level that is closest to and smaller than the second reference current to have the first switching priority, and allowing the second current source having an output current level that is closest to and greater than the second reference current to have the second switching priority.

4. The method for calibrating output current of claim 1, wherein:

the step of determining the first switching sequence of the plurality of first current sources according to the result of the first sorting operation comprises:

allowing a first median current source of the plurality of first current sources having a current value ranked as the median to have a first switching priority; and the step of determining the second switching sequence of the plurality of second current sources according to the result of the second sorting operation and the first switching sequence comprises:

allowing a second median current source of the plurality of second current sources having a current value ranked as the median to have a first switching priority.

5. The method for calibrating output current of claim 4, wherein:

the step of determining the first switching sequence of the plurality of first current sources according to the result of the first sorting operation further comprises:

allowing a first current source having an output current value that is closest to and greater than a first median current outputted from the first median current source to have a second switching priority, and allowing a first current source having an output current value that is closest to and smaller than the first median current to have a third switching priority; or allowing the first current source having an output current value that is closest to and smaller than the first median current to have the second switching priority, and allowing the first current source having an output current value that is closest to and greater than the first median current to have the third switching priority; and the step of determining the second switching sequence of the plurality of second current sources according to the result of the second sorting operation and the first switching sequence further comprises:

when the first current source having an output current value that is closest to and greater than the first median current has the second switching priority, allowing a second current source having an output current value that is closest to and greater than a second median current outputted from the second median current source to have a second switching priority, and allowing a second current source having an output current value that is closest to and smaller than the second median current to have a third switching priority; or when the first current source having an output current value that is closest to and smaller than the first median current has the second switching priority, allowing the second current source having an output current value that is closest to and smaller than the second median current to have the second switching priority, and allowing the second current source having an output current value that is closest to and greater than the second median current to have the third switching priority.

6. The method for calibrating output current of claim 4, wherein:
the step of determining the first switching sequence of the plurality of first current sources according to the result of the first sorting operation further comprises:
for at least one first current source of the plurality of first current sources having an output current greater than a current outputted from the first median current source, sequentially setting at least one switching priority of the at least one first current source according to a current ranking of the at least one first current source in ascending order; and
for at least one other first current source other than the at least one first current source of the plurality of first current sources, sequentially setting at least one switching priority of the at least one other first current source according to a current ranking of the at least one other first current source in ascending order; and
the step of determining the second switching sequence of the plurality of second current sources according to the result of the second sorting operation and the first switching sequence further comprises:
for at least one second current source of the plurality of second current sources having an output current greater than a current outputted from the second median current source, sequentially setting at least one switching priority of the at least one second current source according to a current ranking of the at least one second current source in ascending order; and
for at least one other second current source other than the at least one second current source of the plurality of second current sources, sequentially setting at least one switching priority of the at least one other second current source according to a current ranking of the at least one other second current source in ascending order.

7. The method for calibrating output current of claim 4, wherein:
the step of determining the first switching sequence of the plurality of first current sources according to the result of the first sorting operation further comprises:
for at least one first current source of the plurality of first current sources having an output current smaller than a current outputted from the first median current source, sequentially setting at least one switching priority of the at least one first current source according to a current ranking of the at least one first current source in descending order; and
for at least one other first current source other than the at least one first current source of the plurality of first current sources, sequentially setting at least one switching priority of the at least one other first current source according to a current ranking of the at least one other first current source in descending order; and
the step of determining the second switching sequence of the plurality of second current sources according to the result of the second sorting operation and the first switching sequence further comprises:
for at least one second current source of the plurality of second current sources having an output current smaller than a current outputted from the second median current source, sequentially setting at least one switching priority of the at least one second current source according to a current ranking of the at least one second current source in descending order; and
for at least one other second current source other than the at least one second current source of the plurality of second current sources, sequentially setting at least one switching priority of the at least one other second current source according to a current ranking of the at least one other second current source in descending order.

8. A current control system, comprising:
a first current output circuit, comprising a plurality of first current sources, wherein the plurality of first current sources have a same first target current value;
a second current output circuit, comprising a plurality of second current sources, wherein the plurality of second current sources have a same second target current value; and
a control circuit, coupled to the first current output circuit and the second current output circuit and configured to:
perform a first sorting operation on the plurality of first current sources according to current levels outputted by the plurality of first current sources;
perform a second sorting operation on the plurality of second current sources according to current levels outputted by the plurality of second current sources;
determine a first switching sequence of the plurality of first current sources according to a result of the first sorting operation; and
determine a second switching sequence of the plurality of second current sources according to a result of the second sorting operation and the first switching sequence.

9. The current control system of claim 8, wherein:
the first current output circuit further comprises a plurality of first sub-current sources and a first unit current source, wherein the plurality of first sub-current sources and the first unit current source are configured to jointly generate a first reference current, and a target current value of the first reference current is equal to the first target current value;
the second current output circuit further comprises a plurality of second sub-current sources and a second unit current source, wherein the plurality of second sub-current sources and the second unit current source are configured to jointly generate a second reference current, and a target current value of the second reference current is equal to the second target current value;
the control circuit is configured to perform the first sorting operation on the plurality of first current sources according to the current levels outputted from the plurality of first current sources and the first reference current, and perform the second sorting operation on the plurality of second current sources according to the current levels outputted from the plurality of second current sources and the second reference current;
the plurality of first sub-current sources and the first unit current source have a same first sub-target current value; and
the plurality of second sub-current sources and the second unit current source have a same second sub-target current value.

10. The current control system of claim 9, wherein the control circuit is configured to:

when determining the first switching sequence of the plurality of first current sources, allow a first current source having an output current level that is closest to and greater than the first reference current to have a first switching priority, and allow a first current source having output current level that is closest to and smaller than the first reference current to have a second switching priority, and when determining the second switching sequence of the plurality of second current sources, allow a second current source having an output current level that is closest to and greater than the second reference current to have a first switching priority, and allow a second current source having an output current level that is closest to and smaller than the second reference current to have a second switching priority; or when determining the first switching sequence of the plurality of first current sources, allow the first current source having an output current level that is closest to and smaller than the first reference current to have the first switching priority, and allow the first current source having an output current level that is closest to and greater than the first reference current to have the second switching priority; and when determining the second switching sequence of the plurality of second current sources, allow the second current source having an output current level that is closest to and smaller than the second reference current to have the first switching priority, and allow the second current source having an output current level that is closest to and greater than the second reference current to have the second switching priority.

11. The current control system of claim 9, wherein the control circuit is configured to:
when determining the first switching sequence of the plurality of first current sources:
for at least one first current source of the plurality of first current sources having an output current greater than the first reference current, sequentially set at least one switching priority of the at least one first current source according to a current ranking of the at least one first current source in ascending order; and
for at least one other first current source other than the at least one first current source of the plurality of first current sources, sequentially set at least one switching priority of the at least one other first current source according to a current ranking of the at least one other first current source in ascending order; and
when determining the second switching sequence of the plurality of second current sources:
for at least one second current source of the plurality of second current sources having an output current greater than the second reference current, sequentially set at least one switching priority of the at least one second current source according to a current ranking of the at least one second current source in ascending order; and
for at least one other second current source other than the at least one second current source of the plurality of second current sources, sequentially set at least one switching priority of the at least one other second current source according to a current ranking of the at least one other second current source in ascending order.

12. The current control system of claim 8, wherein the control circuit is configured to:

allow a first median current source of the plurality of first current sources having a current value ranked as the median to have a first switching priority when determining the first switching sequence of the plurality of first current sources; and
allow a second median current source of the plurality of second current sources having a current value ranked as the median to have a first switching priority when determining the second switching sequence of the plurality of second current sources.

13. The current control system of claim 12, wherein the control circuit is configured to:
when determining the first switching sequence of the plurality of first current sources according to the result of the first sorting operation, allow a first current source having an output current value that is closest to and greater than a first median current outputted from the first median current source to have a second switching priority, and allow a first current source having an output current value that is closest to and smaller than the first median current to have a third switching priority; and when determining the second switching sequence of the plurality of second current sources according to the result of the second sorting operation and the first switching sequence, allow a second current source having an output current value that is closest to and greater than a second median current outputted from the second median current source to have a second switching priority, and allow a second current source having an output current value that is closest to and smaller than the second median current to have a third switching priority; or
when determining the first switching sequence of the plurality of first current sources according to the result of the first sorting operation, allow the first current source having an output current value that is closest to and smaller than the first median current to have the second switching priority, and allow the first current source having an output current value that is closest to and greater than the first median current to have the third switching priority; and when determining the second switching sequence of the plurality of second current sources, allow the second current source having an output current value that is closest to and smaller than the second median current to have the second switching priority, and allow the second current source having an output current value that is closest to and greater than the second median current to have the third switching priority.

14. The current control system of claim 12, wherein the control circuit is configured to:
when determining the first switching sequence of the plurality of first current sources:
for at least one first current source of the plurality of first current sources having an output current greater than a current outputted from the first median current source, sequentially set at least one switching priority of the at least one first current source according to a current ranking of the at least one first current source in ascending order; and
for at least one other first current source other than the at least one first current source of the plurality of first current sources, sequentially set at least one switching priority of the at least one other first current source according to a current ranking of the at least one other first current source in ascending order; and when determining the second switching sequence of the plurality of second current sources:
for at least one second current source of the plurality of second current sources having an output current greater than a current outputted from the second median current source, sequentially set at least one switching priority of the at least one second current source according to a current ranking of the at least one second current source in ascending order; and
for at least one other second current source other than the at least one second current source of the plurality of second current sources, sequentially set at least one switching priority of the at least one other second current source according to a current ranking of the at least one other second current source in ascending order.

15. The current control system of claim 12, wherein the control circuit is configured to:
when determining the first switching sequence of the plurality of first current sources:
for at least one first current source of the plurality of first current sources having an output current smaller than a current outputted from the first median current source, sequentially set at least one switching priority of the at least one first current source according to a current ranking of the at least one first current source in descending order; and
for at least one other first current source other than the at least one first current source of the plurality of first current sources, sequentially set at least one switching priority of the at least one other first current source according to a current ranking of the at least one other first current source in descending order; and
when determining the second switching sequence of the plurality of second current sources:
for at least one second current source of the plurality of second current sources having an output current smaller than a current outputted from the second median current source, sequentially set at least one switching priority of the at least one second current source according to a current ranking of the at least one second current source in descending order; and
for at least one other second current source other than the at least one second current source of the plurality of second current sources, sequentially set at least one switching priority of the at least one other second current source according to a current ranking of the at least one other second current source in descending order.

16. A voltage control system, comprising:
a first voltage output circuit, comprising a plurality of first voltage divider units, wherein the plurality of first voltage divider units have a same first target divided voltage level;
a second voltage output circuit, comprising a plurality of second voltage divider units, wherein the plurality of second voltage divider units have a same second target divided voltage level; and
a control circuit, coupled to the first voltage output circuit and the second voltage output circuit and configured to:
perform a first sorting operation on the plurality of first voltage divider units according to divided voltage levels outputted from the plurality of first voltage divider units;
perform a second sorting operation on the plurality of second voltage divider units according to divided voltage levels outputted from the plurality of second voltage divider units;
determine a first series connection sequence of the plurality of first voltage divider units according to a result of the first sorting operation; and
determine a second series connection sequence of the plurality of second voltage divider units according to a result of the second sorting operation and the first series connection sequence.

17. The voltage control system of claim 16, wherein the control circuit is configured to:
allow a first median voltage divider unit of the plurality of first voltage divider units having a divided voltage level ranked as the median to have a first series connection position, when determining the first series connection sequence of the plurality of first voltage divider units; and
allow a second median voltage divider unit of the plurality of second voltage divider units having a divided voltage level ranked as the median to have a first series connection position, when determining the second series connection sequence of the plurality of second voltage divider units.

18. The voltage control system of claim 17, wherein the control circuit is configured to:
when determining the first series connection sequence of the plurality of first voltage divider units, allow a first voltage divider unit having an output divided voltage level that is closest to and greater than a first median divided voltage outputted from the first median voltage divider unit to have a second series connection position, and allow a first voltage divider unit having an output divided voltage level that is closest to and smaller than the first median divided voltage to have a third series connection position; and when determining the second series connection sequence of the plurality of second voltage divider units, allow a second voltage divider unit having an output divided voltage level that is closest to and greater than a second median divided voltage outputted from the second median voltage divider unit to have a second series connection position, and allow a second voltage divider unit having an output divided voltage level that is closest to and smaller than the second median divided voltage to have a third series connection position; or
when determining the first series connection sequence of the plurality of first voltage divider units, allow the first voltage divider unit having an output divided voltage level that is closest to and smaller than the first median divided voltage to have the second series connection position, and allow the first voltage divider unit having an output divided voltage level that is closest to and greater than the first median divided voltage to have the third series connection position; and when determining the second series connection sequence of the plurality of second voltage divider units, allow the second voltage divider unit having an output divided voltage level that is closest to and smaller than the second median divided voltage to have the second series connection position, and allow the second voltage divider unit having an output divided voltage level that is closest to and greater than the second median divided voltage to have the third series connection position.

19. The voltage control system of claim 17, wherein the control circuit is configured to:

when determining the first series connection sequence of the plurality of first voltage divider units:

for at least one first voltage divider unit of the plurality of first voltage divider units having an output divided voltage greater than a divided voltage outputted from the first median voltage divider unit, sequentially set at least one series connection position of the at least one first voltage divider unit according to a divided voltage ranking of the at least one first voltage divider unit in ascending order; and for at least one other first voltage divider unit other than the at least one first voltage divider unit of the plurality of first voltage divider units, sequentially set at least one series connection position of the at least one other first voltage divider unit according to a divided voltage ranking of the at least one other first voltage divider unit in ascending order; and when determining the second series connection sequence of the plurality of second voltage divider units:

for at least one second voltage divider unit of the plurality of second voltage divider units having an output divided voltage greater than a divided voltage outputted from the second median voltage divider unit, sequentially set at least one series connection position of the at least one second voltage divider unit according to a divided voltage ranking of the at least one second voltage divider unit in ascending order; and for at least one other second voltage divider unit other than the at least one second voltage divider unit of the plurality of second voltage divider units, sequentially set at least one series connection position of the at least one other second voltage divider unit according to a divided voltage ranking of the at least one other second voltage divider unit in ascending order.

20. The voltage control system of claim 17, wherein the control circuit is configured to:

when determining the first series connection sequence of the plurality of first voltage divider units:

for at least one first voltage divider unit of the plurality of first voltage divider units having an output divided voltage smaller than a divided voltage outputted from the first median voltage divider unit, sequentially set at least one series connection position of the at least one first voltage divider unit according to a divided voltage ranking of the at least one first voltage divider unit in descending order; and for at least one other first voltage divider unit other than the at least one first voltage divider unit of the plurality of first voltage divider units, sequentially setting at least one series connection position of the at least one other first voltage divider unit according to a divided voltage ranking of the at least one other first voltage divider unit in descending order; and when determining the second series connection sequence of the plurality of second voltage divider units:

for at least one second voltage divider unit of the plurality of second voltage divider units having an output divided voltage smaller than a divided voltage outputted from the second median voltage divider unit, sequentially set at least one series connection position of the at least one second voltage divider unit according to a divided voltage ranking of the at least one second voltage divider unit in descending order; and for at least one other second voltage divider unit other than the at least one second voltage divider unit of the plurality of second voltage divider units, sequentially setting at least one series connection position of the at least one other second voltage divider unit according to a divided voltage ranking of the at least one other second voltage divider unit in descending order.

\* \* \* \* \*